(12) United States Patent
Sato et al.

(10) Patent No.: US 11,757,424 B2
(45) Date of Patent: Sep. 12, 2023

(54) BAND-PASS FILTER

(71) Applicant: TDK CORPORATION, Tokyo (JP)

(72) Inventors: Takuya Sato, Tokyo (JP); Yuta Ashida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/686,071

(22) Filed: Mar. 3, 2022

(65) Prior Publication Data

US 2022/0294410 A1  Sep. 15, 2022

(30) Foreign Application Priority Data

Mar. 9, 2021 (JP) ................................. 2021-037867

(51) Int. Cl.
*H03H 7/01* (2006.01)
*H03H 7/075* (2006.01)
*H03H 1/00* (2006.01)

(52) U.S. Cl.
CPC ........ *H03H 7/0161* (2013.01); *H03H 7/0115* (2013.01); *H03H 7/075* (2013.01); *H03H 7/1741* (2013.01); *H03H 2001/0085* (2013.01)

(58) Field of Classification Search
CPC ............... H03H 7/0161; H03H 7/0115; H03H 2001/0085; H03H 7/0123
USPC .................................................. 333/175, 185
See application file for complete search history.

(56) References Cited

U.S. PATENT DOCUMENTS

2018/0006625 A1* 1/2018 Kaminishi ............... H03H 7/46

FOREIGN PATENT DOCUMENTS

JP    H09-181549 A    7/1997
JP    2009-267811 A   11/2009

* cited by examiner

*Primary Examiner* — Rakesh B Patel
(74) *Attorney, Agent, or Firm* — Oliff PLC

(57) ABSTRACT

A band-pass filter includes a first input/output port, a second input/output port, a first high-pass filter, a first low-pass filter, and a first stub resonator. The first stub resonator includes a first distributed constant line. The first low-pass filter is provided between the first input/output port and the first high-pass filter in the circuit configuration. The first distributed constant line has a first end connected to a first path connecting the first input/output port and the first low-pass filter, and a second end closest to a ground in the circuit configuration.

12 Claims, 14 Drawing Sheets

BAND-PASS FILTER

BACKGROUND OF THE INVENTION

1. Field of the Invention

The present invention relates to a band-pass filter including a high-pass filter and a low-pass filter.

2. Description of the Related Art

The recent market demands for reductions in size and footprint of the compact mobile communication apparatuses have also required miniaturization of band-pass filters for use in those communication apparatus. Among known band-pass filters suited for miniaturization are ones that use a stack of dielectric layers and conductor layers.

A band-pass filter can be formed by serially connecting a high-pass filter that forms an attenuation pole on the low frequency side of the passband of the band-pass filter and a low-pass filter that forms an attenuation pole on the high frequency side of the passband of the band-pass filter. Each of the high- and low-pass filters may be a filter including at least one inductor and at least one capacitor.

JP H9-181549 A and JP 2009-267811 A disclose a band-pass filter including a high-pass filter and a low-pass filter connected in series.

Communication services using the fifth generation mobile communication system (hereinafter, referred to as 5G) are currently starting to be provided. In 5G, 10-GHz and higher frequency bands, or especially 10- to 30-GHz quasi-millimeter wavebands and 30- to 300-GHz millimeter wavebands, are assumed to be used. The use of frequency bands higher than heretofore requires band-pass filters to meet characteristic requirements in the frequency bands higher than heretofore. For example, the pass attenuation of a band-pass filter on the high frequency side of the passband of the band-pass filter is desired to be increased.

SUMMARY OF THE INVENTION

An object of the present invention is to provide a band-pass filter having an increased pass attenuation on the high frequency side of its passband.

A band-pass filter according to the present invention is a band-pass filter that selectively passes a signal of a frequency within a predetermined passband. The band-pass filter includes a first input/output port, a second input/output port, and a first high-pass filter, a first low-pass filter, and a first stub resonator that are provided between the first input/output port and the second input/output port in a circuit configuration. Each of the first high-pass filter and the first low-pass filter includes at least one first inductor and at least one first capacitor. The first stub resonator includes a first distributed constant line.

The first low-pass filter is provided between the first input/output port and the first high-pass filter in the circuit configuration. The first distributed constant line has a first end connected to a first path connecting the first input/output port and the first low-pass filter, and a second end closest to a ground in the circuit configuration.

In the band-pass filter according to the present invention, the first stub resonator may further include a second capacitor provided between the first distributed constant line and the ground in the circuit configuration.

In the band-pass filter according to the present invention, each of the first low-pass filter and the first stub resonator may form an attenuation pole on a high frequency side of the passband.

In the band-pass filter according to the present invention, the first distributed constant line may be a quarter-wave line.

The band-pass filter according to the present invention may further include a stack for integrating the first input/output port, the second input/output port, the first high-pass filter, the first low-pass filter, and the first stub resonator, where the stack includes a plurality of dielectric layers and a plurality of conductor layers stacked together. In such a case, the plurality of conductor layers may include a first conductor line constituting the first distributed constant line, and a ground conductor layer connected to the ground. A part of the first conductor line may be opposed to the ground conductor layer.

The band-pass filter according to the present invention may further include a second high-pass filter, a second low-pass filter, and a second stub resonator that are provided between the first high-pass filter and the second input/output port in the circuit configuration. In such a case, each of the second high-pass filter and the second low-pass filter may include at least one second inductor and at least one third capacitor. The second stub resonator may include a second distributed constant line. The second low-pass filter may be provided between the second input/output port and the second high-pass filter in the circuit configuration. The second distributed constant line may have a third end connected to a second path connecting the second input/output port and the second low-pass filter, and a fourth end closest to the ground in the circuit configuration.

In the band-pass filter according to the present invention, the second stub resonator may further include a fourth capacitor provided between the second distributed constant line and the ground in the circuit configuration.

In the band-pass filter according to the present invention, the second distributed constant line may be a quarter-wave line.

The band-pass filter according to the present invention may further include a stack for integrating the first input/output port, the second input/output port, the first high-pass filter, the first low-pass filter, the first stub resonator, the second high-pass filter, the second low-pass filter, and the second stub resonator, where the stack includes a plurality of dielectric layers and a plurality of conductor layers stacked together. In such a case, the plurality of conductor layers may include a first conductor line constituting the first distributed constant line, a second conductor line constituting the second distributed constant line, and a ground conductor layer connected to the ground. A part of the first conductor line and a part of the second conductor line may be opposed to the ground each.

The band-pass filter according to the present invention may further includes at least one resonator provided between the first high-pass filter and the second high-pass filter in the circuit configuration. In such a case, the at least one resonator may include a third inductor provided between a third path connecting the first high-pass filter to the second high-pass filter and the ground in the circuit configuration.

The band-pass filter according to the present invention includes the first high-pass filter, the first low-pass filter, and the first stub resonator. The first stub resonator includes the first distributed constant line. The first low-pass filter is provided between the first input/output port and the first high-pass filter in the circuit configuration. The first distributed constant line is connected to the first path connecting the first input/output port and the first low-pass filter. According to the present invention with this configuration, the pass attenuation on the high frequency side of the passband can thus be increased.

Other and further objects, features and advantages of the present invention will appear more fully from the following description.

DETAILED DESCRIPTION OF THE PREFERRED EMBODIMENTS

Figure 1:
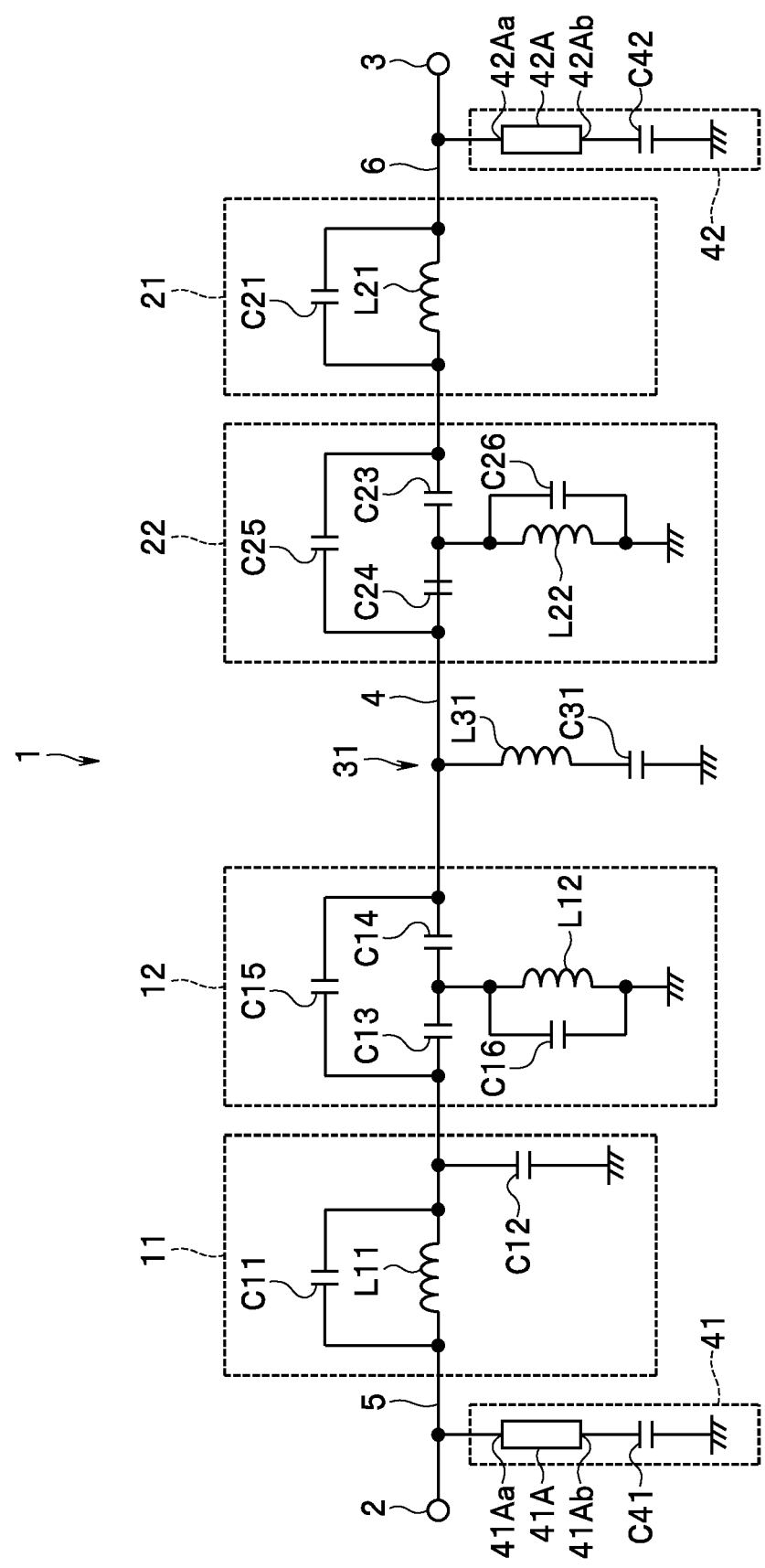
FIG. 1 is a circuit diagram showing a circuit configuration of a band-pass filter according to an embodiment of the invention.

An embodiment of the present invention will now be described in detail with reference to the drawings. First, the configuration of a band-pass filter according to the embodiment of the invention will be outlined with reference to FIG. 1. A band-pass filter 1 according to the present embodiment selectively passes a signal of a frequency within a predetermined passband. The band-pass filter 1 includes a first input/output port 2, a second input/output port 3, a first high-pass filter 12, a first low-pass filter 11, a second high-pass filter 22, a second low-pass filter 21, a resonator 31, a first stub resonator 41, and a second stub resonator 42. The first high-pass filter 12, the first low-pass filter 11, the second high-pass filter 22, the second low-pass filter 21, the resonator 31, the first stub resonator 41, and the second stub resonator 42 are provided between the first input/output port 2 and the second input/output port 3 in a circuit configuration.

In the present application, the expression of "in the (a) circuit configuration" is used to indicate not layout in physical configuration but layout in the circuit diagram.

The first low-pass filter 11 is provided between the first input/output port 2 and the first high-pass filter 12 in the circuit configuration. The first low-pass filter 11 is connected to the first input/output port 2.

The second high-pass filter 22 is provided between the first high-pass filter 12 and the second input/output port 3 in the circuit configuration. The second low-pass filter 21 is provided between the second input/output port 3 and the second high-pass filter 22 in the circuit configuration. The second low-pass filter 21 is connected to the second input/output port 3.

The resonator 31 is provided between the first high-pass filter 12 and the second high-pass filter 22 in the circuit configuration.

Each of the first high-pass filter 12, the first low-pass filter 11, the second high-pass filter 22, and the second low-pass filter 21 is composed of an LC resonator circuit including an inductor and a capacitor.

The resonator 31 includes an inductor provided between a path 4 connecting the first high-pass filter 12 to the second low-pass filter 21 and a ground in the circuit configuration.

The first stub resonator 41 incudes a first distributed constant line 41A and a capacitor C41. The first distributed constant line 41A is a quarter-wave line. The first distributed constant line 41A has a first end 41Aa connected to a first path 5 connecting the first input/output port 2 and the first low-pass filter 11, and a second end 41Ab closest to the ground in the circuit configuration. The capacitor C41 is provided between the first distributed constant line 41A and the ground in the circuit configuration.

The second stub resonator 42 incudes a second distributed constant line 42A and a capacitor C42. The second distributed constant line 42A is a quarter-wave line. The second distributed constant line 42A has a first end 42Aa connected to a second path 6 connecting the second input/output port 3 and the second low-pass filter 21, and a second end 42Ab closest to the ground in the circuit configuration. The capacitor C42 is provided between the second distributed constant line 42A and the ground in the circuit configuration.

Next, an example of the configuration of the first high-pass filter 12, the first low-pass filter 11, the second high-pass filter 22, the second low-pass filter 21, and the resonator 31 will be described with reference to FIG. 1.

The first low-pass filter 11 includes an inductor L11 and capacitors C11 and C12. One end of the inductor L11 is connected to the first input/output port 2. The capacitor C11 is connected in parallel with the inductor L11. One end of the capacitor C12 is connected to the other end of the inductor L11. The other end of the capacitor C12 is connected to a ground.

The first high-pass filter 12 includes an inductor L12 and capacitors C13, C14, C15, and C16. One end of the capacitor C13 is connected to the other end of the inductor L11 of the first low-pass filter 11. One end of the capacitor C14 is connected to the other end of the capacitor C13. One end of the capacitor C15 is connected to the one end of the capacitor C13. The other end of the capacitor C15 is connected to the other end of the capacitor C14.

One end of the inductor L12 is connected to a connection point between the capacitor C13 and the capacitor C14. The other end of the inductor L12 is connected to the ground.

The second low-pass filter 21 includes an inductor L21 and a capacitor C21. One end of the inductor L21 is connected to the second input/output port 3. The capacitor C21 is connected in parallel with the inductor L21.

The second high-pass filter 22 includes an inductor L22 and capacitors C23, C24, C25, and C26. One end of the capacitor C23 is connected to the other end of the inductor L21 of the second low-pass filter 21. One end of the capacitor C24 is connected to the other end of the capacitor C23. One end of the capacitor C25 is connected to the one end of the capacitor C23. The other end of the capacitor C25 is connected to the other end of the capacitor C24.

One end of the inductor L22 is connected to a connection point between the capacitor C23 and the capacitor C24. The other end of the inductor L22 is connected to the ground. The capacitor C26 is connected in parallel with the inductor L22.

The path 4 connecting the first high-pass filter 12 and the second high-pass filter 22 connects the other end of the capacitor C14 of the first high-pass filter 12 and the other end of the capacitor C24 of the second high-pass filter 22.

The resonator 31 includes an inductor L31 and a capacitor C31. One end of the inductor L31 is connected to the path 4 at a position closer to the first high-pass filter 12 than is the second high-pass filter 22 in the circuit configuration. One end of the capacitor C31 is connected to the other end of the inductor L31. The other end of the capacitor C31 is connected to the ground.

Figure 2:
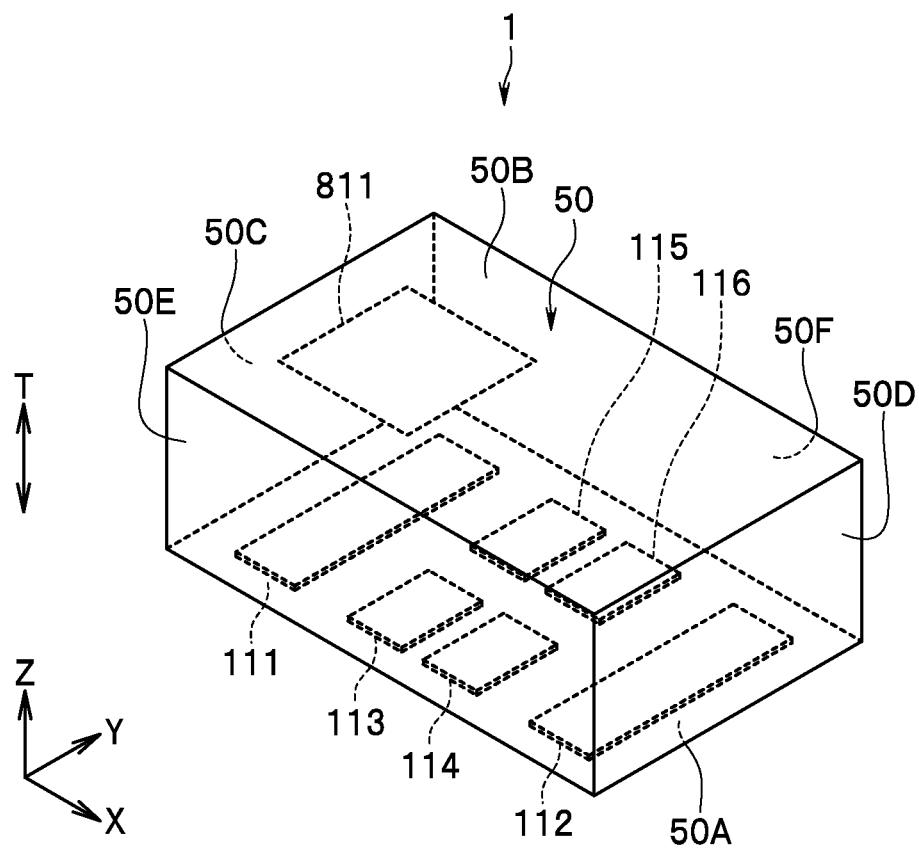
FIG. 2 is a perspective view showing an outside view of the band-pass filter according to the embodiment of the invention.

Next, other configurations of the band-pass filter 1 will be described with reference to FIG. 2. FIG. 2 is a perspective view showing an outside view of the band-pass filter 1.

The band-pass filter 1 further includes a stack 50 of dielectric layers and conductor layers. The stack 50 is intended to integrate the first input/output port 2, the second input/output port 3, the first high-pass filter 12, the first low-pass filter 11, the second high-pass filter 22, the second low-pass filter 21, the resonator 31, the first stub resonator 41, and the second stub resonator 42. The first high-pass filter 12, the first low-pass filter 11, the second high-pass filter 22, the second low-pass filter 21, the resonator 31, the first stub resonator 41, and the second stub resonator 42 are formed using the plurality of conductor layers.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as —X, —Y, and —Z directions, respectively.

As shown in FIG. 2, the bottom surface 50A is located at the end of the stack 50 in the -Z direction. The top surface 50B is located at the end of the stack 50 in the Z direction. The bottom surface 50A and the top surface 50B each have a rectangular shape long in the X direction. The side surface 50C is located at the end of the stack 50 in the -X direction. The side surface 50D is located at the end of the stack 50 in the X direction. The side surface 50E is located at the end of the stack 50 in the —Y direction. The side surface 50F is located at the end of the stack 50 in the Y direction.

The band-pass filter 1 further includes a plurality of terminals 111, 112, 113, 114, 115, and 116 located at the bottom surface 50A of the stack 50. The terminal 111 extends in the Y direction near the side surface 50C. The terminal 112 extends in the Y direction near the side surface 50D. The terminals 113 to 116 are located between the terminals 111 and 112. The terminals 113 and 114 are arranged in this order in the X direction at positions closer to the side surface 50E than to the side surface 50F. The terminals 115 and 116 are arranged in this order in the X direction at positions closer to the side surface 50F than to the side surface 50E.

The terminal 111 corresponds to the first input/output port 2. The terminal 112 corresponds to the second input/output port 3. The first and second input/output ports 2 and 3 are thus located at the bottom surface 50A of the stack 50. Each of the terminals 113 to 116 is connected to the ground.

Next, an example of the plurality of dielectric layers and the plurality of conductor layers constituting the stack 50 will be described with reference to FIG. 3A to FIG. 9B. In this example, the stack 50 includes twenty dielectric layers stacked together. The twenty dielectric layers will be referred to as a first to a twentieth dielectric layer in the order from bottom to top. The first to twentieth dielectric layers are denoted by reference numerals 51 to 70, respectively.

Figure 3A:
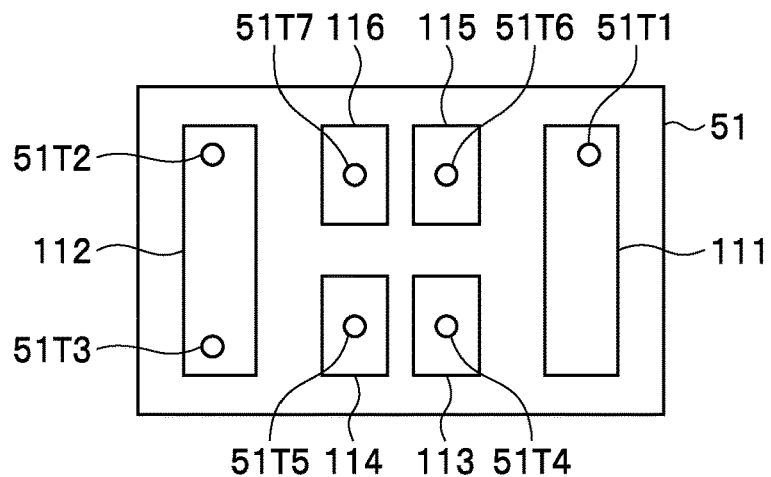
FIG. 3A to FIG. 3C are explanatory diagrams showing respective patterned surfaces of first to third dielectric layers of a stack of the band-pass filter according to the embodiment of the invention.

FIG. 3A shows the patterned surface of the first dielectric layer 51. The terminals 111, 112, 113, 114, 115, and 116 are formed on the patterned surface of the dielectric layer 51. Further, through holes 51T1, 51T2, 51T3, 51T4, 51T5, 51T6, and 51T7 are formed in the dielectric layer 51. The through hole 51T1 is connected to the terminal 111. The through holes 51T2 and 51T3 are connected to the terminal 112. The through holes 51T4 to 51T7 are connected to terminals 113 to 116, respectively.

Figure 3B:
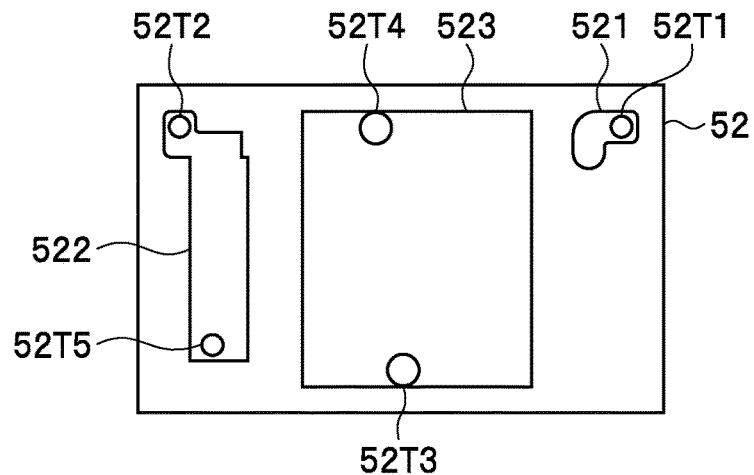

FIG. 3B shows the patterned surface of the second dielectric layer 52. Conductor layers 521 and 522 and a ground conductor layer 523 are formed on the patterned surface of the dielectric layer 52. Further, through holes 52T1, 52T2, 52T3, 52T4, and 52T5 are formed in the dielectric layer 52. The through hole 51T1 formed in the dielectric layer 51 and the through hole 52T1 are connected to the conductor layer 521. The through holes 51T2 and 51T3 formed in the dielectric layer 51 and the through holes 52T2 and 52T5 are connected to the conductor layer 522. The through holes 51T4 to 51T7 formed in the dielectric layer 51 and the through holes 52T3 and 52T4 are connected to the ground conductor layer 523.

Figure 3C:
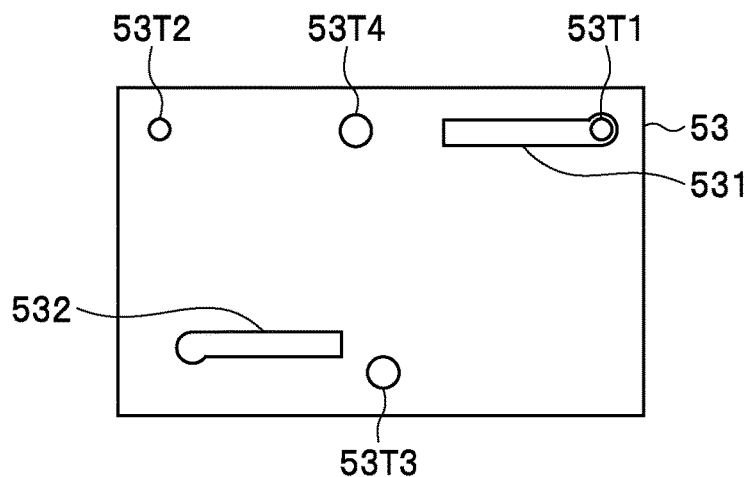

FIG. 3C shows the patterned surface of the third dielectric layer 53. A first conductor line 531 constituting the first distributed constant line and a second conductor line 532 constituting the second distributed constant line are formed on the patterned surface of the dielectric layer 53. Further, through holes 53T1, 53T2, 53T3, and 53T4 are formed in the dielectric layer 53. The through hole 52T1 formed in the dielectric layer 52 and the through hole 53T1 are connected to the first conductor line 531. The through holes 52T2 to 52T4 formed in the dielectric layer 52 are connected to the through holes 53T2 to 53T4, respectively. The through hole 52T5 formed in the dielectric layer 52 is connected to the second conductor line 532.

Figure 4A:
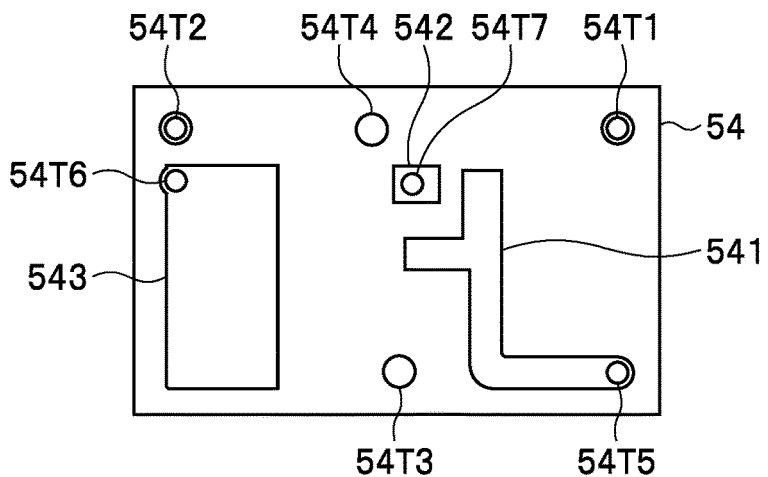
FIG. 4A to FIG. 4C are explanatory diagrams showing respective patterned surfaces of fourth to sixth dielectric layers of the stack of the band-pass filter according to the embodiment of the invention.

FIG. 4A shows the patterned surface of the fourth dielectric layer 54. Conductor layers 541, 542, and 543 are formed on the patterned surface of the dielectric layer 54. Further, through holes 54T1, 54T2, 54T3, 54T4, 54T5, 54T6, and 54T7 are formed in the dielectric layer 54. The through holes 53T1 to 53T4 formed in the dielectric layer 53 are connected to the through holes 54T1 to 54T4, respectively. The through hole 54T5 is connected to the conductor layer 541. The through hole 54T6 is connected to the conductor layer 543. The through hole 54T7 is connected to the conductor layer 542.

Figure 4B:
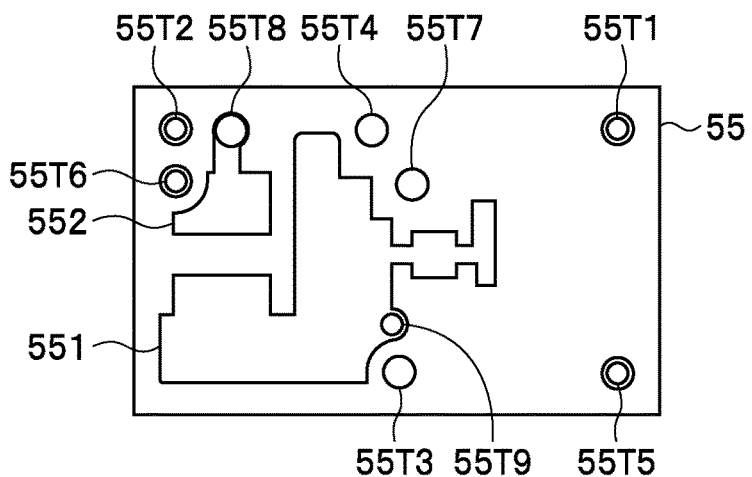

FIG. 4B shows the patterned surface of the fifth dielectric layer 55. Conductor layers 551 and 552 are formed on the patterned surface of the dielectric layer 55. Further, through holes 55T1, 55T2, 55T3, 55T4, 55T5, 55T6, 55T7, 55T8, and 55T9 are formed in the dielectric layer 55. The through holes 54T1 to 54T7 formed in the dielectric layer 54 are connected to the through holes 55T1 to 55T7, respectively. The through hole 55T8 is connected to the conductor layer 552. The through hole 55T9 is connected to the conductor layer 551.

Figure 4C:
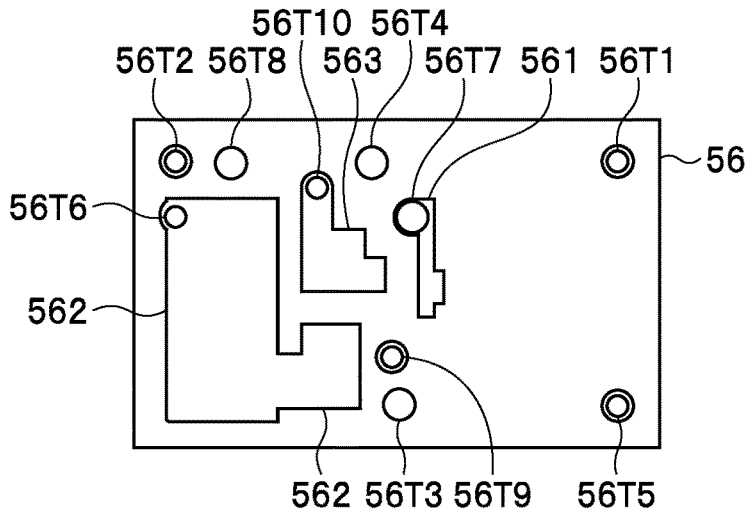

FIG. 4C shows the patterned surface of the sixth dielectric layer 56. Conductor layers 561, 562, and 563 are formed on the patterned surface of the dielectric layer 56. Further, through holes 56T1, 56T2, 56T3, 56T4, 56T5, 56T6, 56T7, 56T8, 56T9, and 56T10 are formed in the dielectric layer 56. The through holes 55T1 to 55T5, 55T8, and 55T9 formed in the dielectric layer 55 are connected to the through holes 56T1 to 56T5, 56T8, and 56T9, respectively. The through hole 55T6 formed in the dielectric layer 55 and the through hole 56T6 are connected to the conductor layer 562. The through hole 55T7 formed in the dielectric layer 55 and the through hole 56T7 are connected to the conductor layer 561. The through hole 56T10 is connected to the conductor layer 563.

Figure 5A:
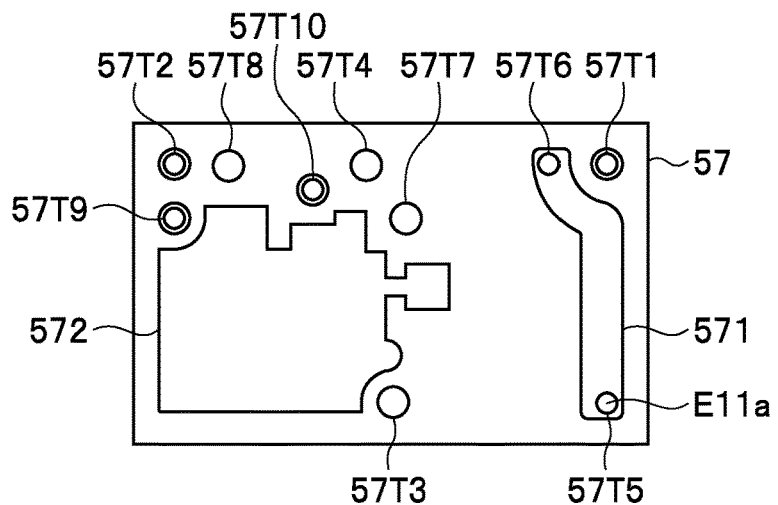
FIG. 5A to FIG. 5C are explanatory diagrams showing respective patterned surfaces of seventh to ninth dielectric layers of the stack of the band-pass filter according to the embodiment of the invention.

FIG. 5A shows the patterned surface of the seventh dielectric layer 57. Conductor layers 571 and 572 are formed on the patterned surface of the dielectric layer 57. The conductor layer 571 has a first end and a second end opposite to each other. Further, through holes 57T1, 57T2, 57T3, 57T4, 57T5, 57T6, 57T7, 57T8, 57T9, and 57T10 are formed in the dielectric layer 57. The through holes 56T1 to 56T4, 56T7, 56T8 and 56T10 formed in the dielectric layer 56 are connected to the through holes 57T1 to 57T4, 57T7, 57T8, and 57T10, respectively. The through hole 56T6 formed in the dielectric layer 56 is connected to the through hole 57T9. The through hole 56T9 formed in the dielectric layer 56 is connected to the conductor layer 572. The through hole 56T5 formed in the dielectric layer 56 and the through hole 57T5 are connected to a portion of the conductor layer 571 near the first end thereof. The through hole 57T6 is connected to a portion of the conductor layer 571 near the second end thereof.

Figure 5B:
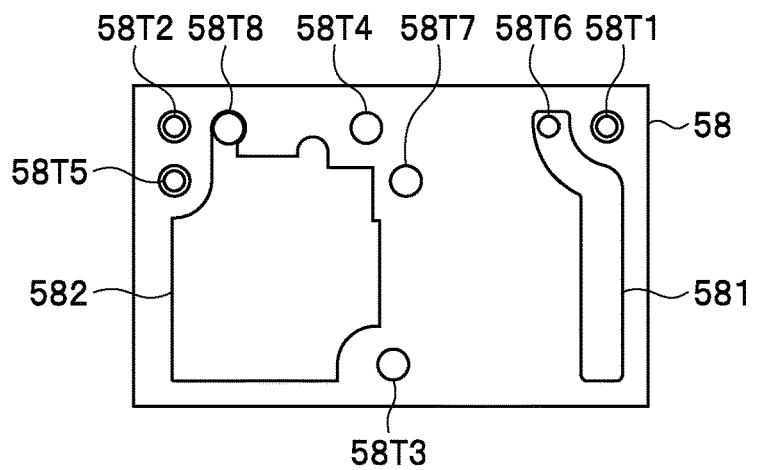

FIG. 5B shows the patterned surface of the eighth dielectric layer 58. Conductor layers 581 and 582 are formed on the patterned surface of the dielectric layer 58. The conductor layer 581 has a first end and a second end opposite to each other. Further, through holes 58T1, 58T2, 58T3, 58T4, 58T5, 58T6, 58T7, and 58T8 are formed in the dielectric layer 58. The through holes 57T1 to 57T4 and 57T7 formed in the dielectric layer 57 are connected to the through holes 58T1 to 58T4 and 58T7, respectively. The through hole 57T5 formed in the dielectric layer 57 is connected to a portion of the conductor layer 581 near the first end thereof. The through hole 57T6 formed in the dielectric layer 57 and the through hole 58T6 are connected to a portion of the conductor layer 581 near the second end thereof. The through hole 57T9 formed in the dielectric layer 57 is connected to the through hole 58T5. The through hole 57T10 formed in the dielectric layer 57 is connected to the conductor layer 582.

Figure 5C:
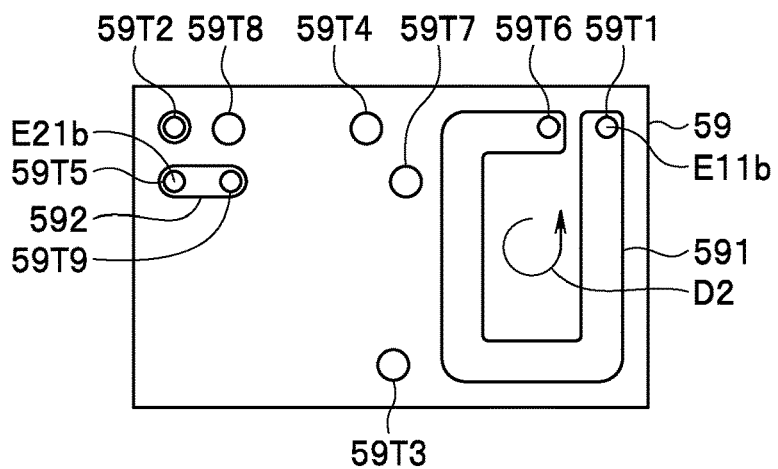

FIG. 5C shows the patterned surface of the ninth dielectric layer 59. Conductor layers 591 and 592 are formed on the patterned surface of the dielectric layer 59. Each of the conductor layer 591 and 592 has a first end and a second end opposite to each other. Further, through holes 59T1, 59T2, 59T3, 59T4, 59T5, 59T6, 59T7, 59T8, and 59T9 are formed in the dielectric layer 59. The through hole 58T1 formed in the dielectric layer 58 and the through hole 59T1 are connected to a portion of the conductor layer 591 near the first end thereof. The through holes 58T2 to 58T4, 58T7, and 58T8 formed in the dielectric layer 58 are connected to the through holes 59T2 to 59T4, 59T7, and 59T8, respectively. The through hole 58T5 formed in the dielectric layer 58 and the through hole 59T5 are connected to a portion of the conductor layer 592 near the first end thereof. The through hole 58T6 formed in the dielectric layer 58 and the through hole 59T6 are connected to a portion of the conductor layer 591 near the second end thereof. The through hole 59T9 is connected to a portion of the conductor layer 592 near the second end thereof.

Figure 6A:
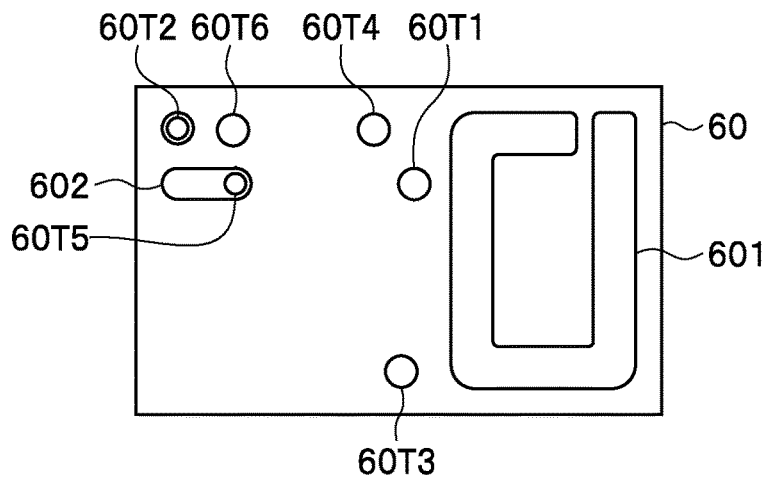
FIG. 6A to FIG. 6C are explanatory diagrams showing respective patterned surfaces of tenth to twelfth dielectric layers of the stack of the band-pass filter according to the embodiment of the invention.

FIG. 6A shows the patterned surface of the tenth dielectric layer 60. Conductor layers 601 and 602 are formed on the patterned surface of the dielectric layer 60. Each of the conductor layer 601 and 602 has a first end and a second end opposite to each other. Further, through holes 60T1, 60T2, 60T3, 60T4, 60T5, and 60T6 are formed in the dielectric layer 60. The through hole 59T1 formed in the dielectric layer 59 is connected to a portion of the conductor layer 601 near the first end thereof. The through holes 59T2 to 59T4 formed in the dielectric layer 59 are connected to the through holes 60T2 to 60T4, respectively. The through hole 59T5 formed in the dielectric layer 59 is connected to a portion of the conductor layer 602 near the first end thereof. The through hole 59T6 formed in the dielectric layer 59 is connected to a portion of the conductor layer 601 near the second end thereof. The through hole 59T7 formed in the dielectric layer 59 is connected to the through hole 60T1. The through hole 59T8 formed in the dielectric layer 59 is connected to the through hole 60T6. The through hole 59T9 formed in the dielectric layer 59 and the through hole 60T5 are connected to a portion of the conductor layer 602 near the second end thereof.

Figure 6B:
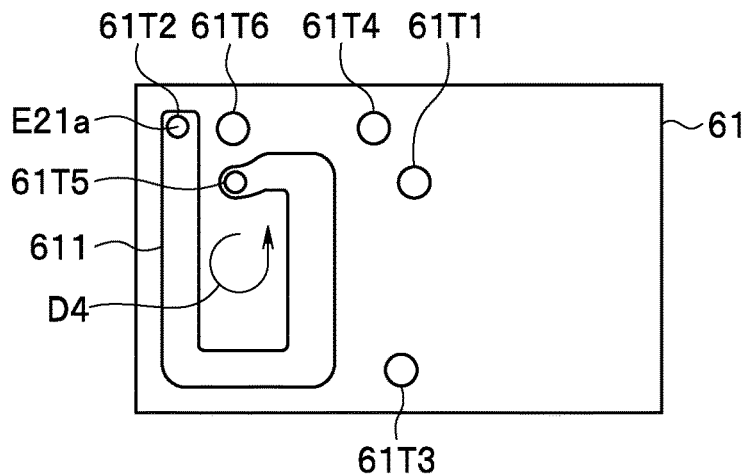

FIG. 6B shows the patterned surface of the eleventh dielectric layer 61. A conductor layer 611 is formed on the patterned surface of the dielectric layer 61. The conductor layer 611 has a first end and a second end opposite to each other. Further, through holes 61T1, 61T2, 61T3, 61T4, 61T5, and 61T6 are formed in the dielectric layer 61. The through holes 60T1, 60T3, 60T4, and 60T6 formed in the dielectric layer 60 are connected to the through holes 61T1, 61T3, 61T4, and 61T6, respectively. The through hole 60T2 formed in the dielectric layer 60 and the through hole 61T2 are connected to a portion of the conductor layer 611 near the first end thereof. The through hole 60T5 formed in the dielectric layer 60 and the through hole 61T5 are connected to a portion of the conductor layer 611 near the second end thereof.

Figure 6C:
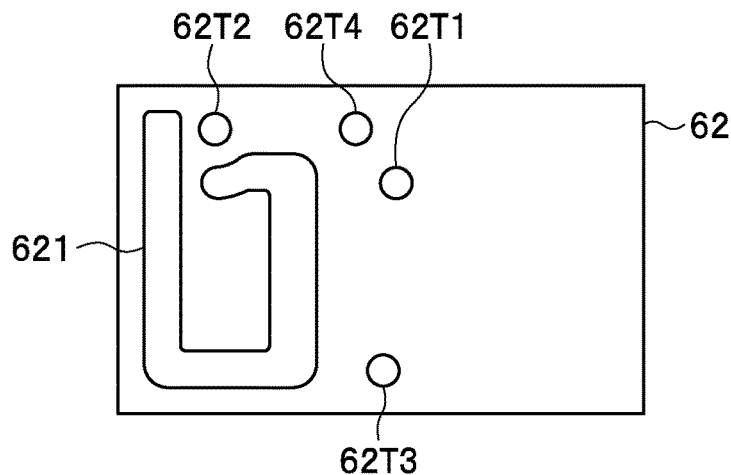

FIG. 6C shows the patterned surface of the twelfth dielectric layer 62. A conductor layer 621 is formed on the patterned surface of the dielectric layer 62. The conductor layer 621 has a first end and a second end opposite to each other. Further, through holes 62T1, 62T2, 62T3, and 62T4 are formed in the dielectric layer 62. The through holes 61T1, 61T3, and 61T4 formed in the dielectric layer 61 are connected to the through holes 62T1, 62T3, and 62T4, respectively. The through hole 61T2 formed in the dielectric layer 61 is connected to a portion of the conductor layer 621 near the first end thereof. The through hole 61T5 formed in the dielectric layer 61 is connected to a portion of the conductor layer 621 near the second end thereof. The through hole 61T6 formed in the dielectric layer 61 is connected to the through hole 62T2.

Figure 7A:
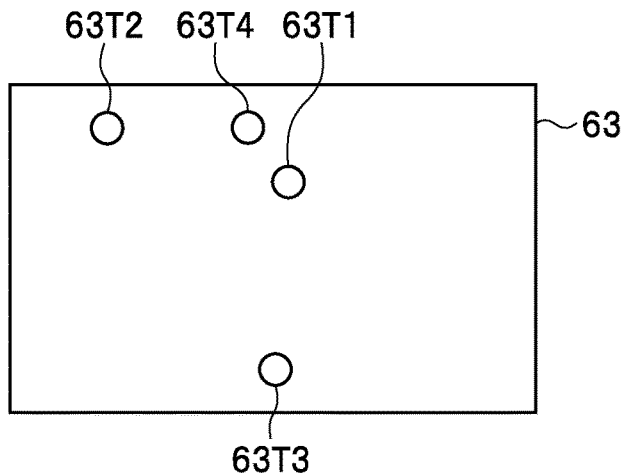
FIG. 7A to FIG. 7C are explanatory diagrams showing respective patterned surfaces of thirteenth to fifteenth dielectric layers of the stack of the band-pass filter according to the embodiment of the invention.

FIG. 7A shows the patterned surface of the thirteenth dielectric layer 63. Through holes 62T1, 63T2, 63T3, and 63T4 are formed in the dielectric layer 63. The through holes 62T1 to 62T4 formed in the dielectric layer 62 are connected to the through holes 63T1 to 63T4, respectively.

Figure 7B:
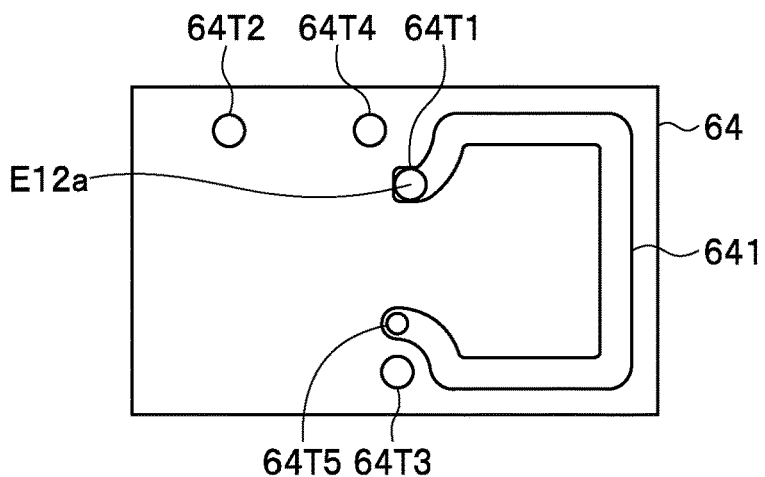

FIG. 7B shows the patterned surface of the fourteenth dielectric layer 64. A conductor layer 641 is formed on the patterned surface of the dielectric layer 64. The conductor layer 641 has a first end and a second end opposite to each other. Further, through holes 64T1, 64T2, 64T3, 64T4, and 64T5 are formed in the dielectric layer 64. The through hole 63T1 formed in the dielectric layer 63 and the through hole 64T1 are connected to a portion of the conductor layer 641 near the first end thereof. The through holes 63T2 to 63T4 formed in the dielectric layer 63 are connected to the through holes 64T2 to 64T4, respectively. The through hole 64T5 is connected to a portion of the conductor layer 641 near the second end thereof.

Figure 7C:
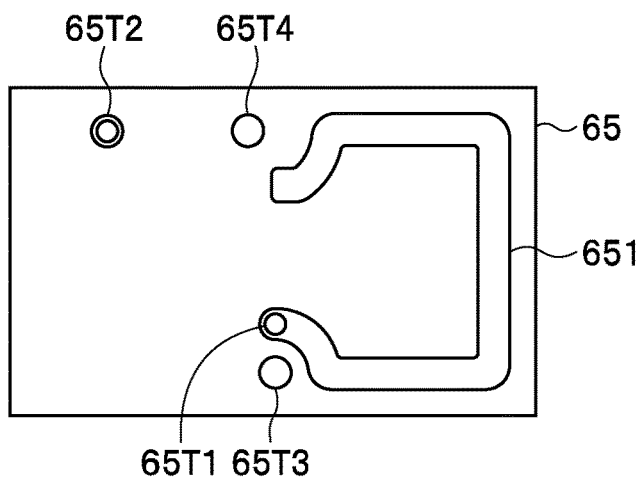

FIG. 7C shows the patterned surface of the fifteenth dielectric layer 65. A conductor layer 651 is formed on the patterned surface of the dielectric layer 65. The conductor layer 651 has a first end and a second end opposite to each other. Further, through holes 65T1, 65T2, 65T3, and 65T4 are formed in the dielectric layer 65. The through hole 64T1 formed in the dielectric layer 64 is connected to a portion of the conductor layer 651 near the first end thereof. The through holes 64T2 to 64T4 formed in the dielectric layer 64 are connected to the through holes 65T2 to 65T4, respectively. The through hole 64T5 formed in the dielectric layer 64 and the through hole 65T1 are connected to a portion of the conductor layer 651 near the second end thereof.

Figure 8A:
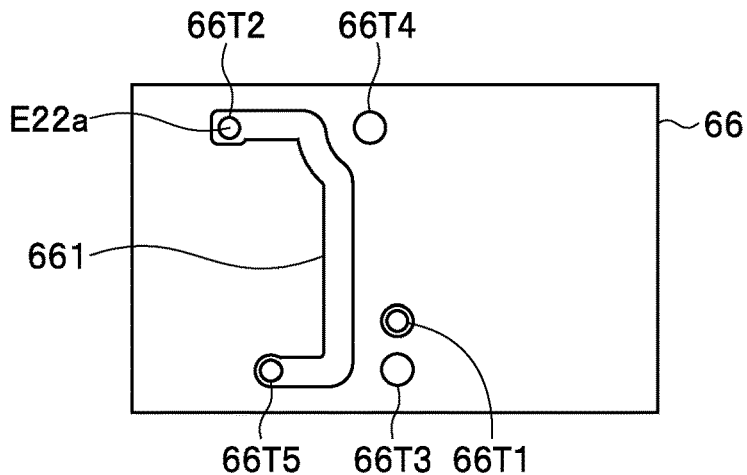
FIG. 8A to FIG. 8C are explanatory diagrams showing respective patterned surfaces of sixteenth to eighteenth dielectric layers of the stack of the band-pass filter according to the embodiment of the invention.

FIG. 8A shows the patterned surface of the sixteenth dielectric layer 66. A conductor layer 661 is formed on the patterned surface of the dielectric layer 66. The conductor layer 661 has a first end and a second end opposite to each other. Further, through holes 66T1, 66T2, 66T3, 66T4, and 66T5 are formed in the dielectric layer 66. The through holes 65T1, 65T3, and 65T4 formed in the dielectric layer 65 are connected to the through holes 66T1, 66T3, and 66T4, respectively. The through hole 65T2 formed in the dielectric layer 65 and the through hole 66T2 are connected to a portion of the conductor layer 661 near the first end thereof. The through hole 66T5 is connected to a portion of the conductor layer 661 near the second end thereof.

Figure 8B:
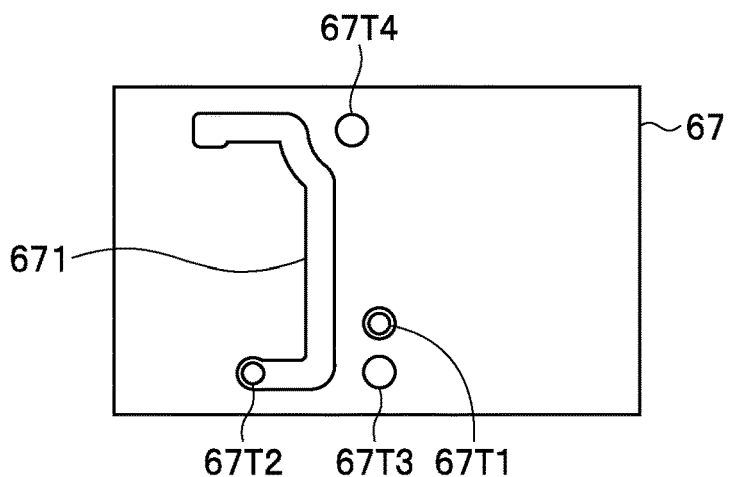

FIG. 8B shows the patterned surface of the seventeenth dielectric layer 67. A conductor layer 671 is formed on the patterned surface of the dielectric layer 67. The conductor layer 671 has a first end and a second end opposite to each other. Further, through holes 67T1, 67T2, 67T3, and 67T4 are formed in the dielectric layer 67. The through holes 66T1, 66T3, and 66T4 formed in the dielectric layer 66 are connected to the through holes 67T1, 67T3, and 67T4, respectively. The through hole 66T2 formed in the dielectric layer 66 is connected to a portion of the conductor layer 671 near the first end thereof. The through hole 66T5 formed in the dielectric layer 66 and the through hole 67T2 are connected to a portion of the conductor layer 671 near the second end thereof.

Figure 8C:
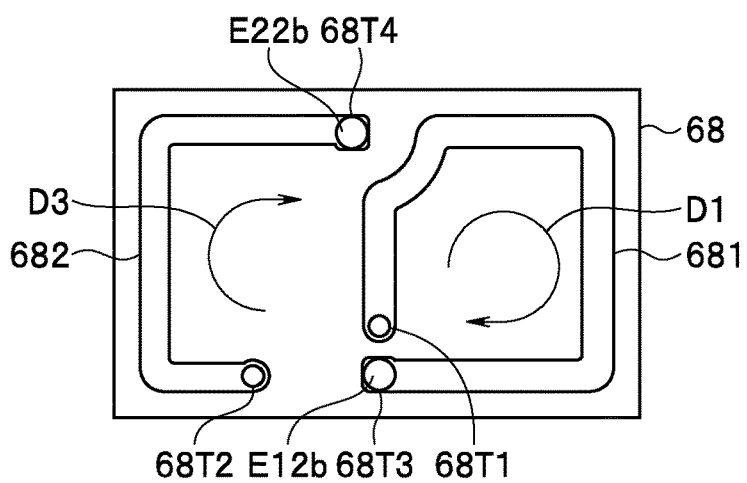

FIG. 8C shows the patterned surface of the eighteenth dielectric layer 68. Conductor layers 681 and 682 are formed on the patterned surface of the dielectric layer 68. Each of the conductor layer 681 and 682 has a first end and a second end opposite to each other. Further, through holes 68T1, 68T2, 68T3, and 68T4 are formed in the dielectric layer 68. The through hole 67T1 formed in the dielectric layer 67 and the through hole 68T1 are connected to a portion of the conductor layer 681 near the first end thereof. The through hole 67T2 formed in the dielectric layer 67 and the through hole 68T2 are connected to a portion of the conductor layer 682 near the first end thereof. The through hole 67T3 formed in the dielectric layer 67 and the through hole 68T3 are connected to a portion of the conductor layer 681 near the second end thereof. The through hole 67T4 formed in the dielectric layer 67 and the through hole 68T4 are connected to a portion of the conductor layer 682 near the second end thereof.

Figure 9A:
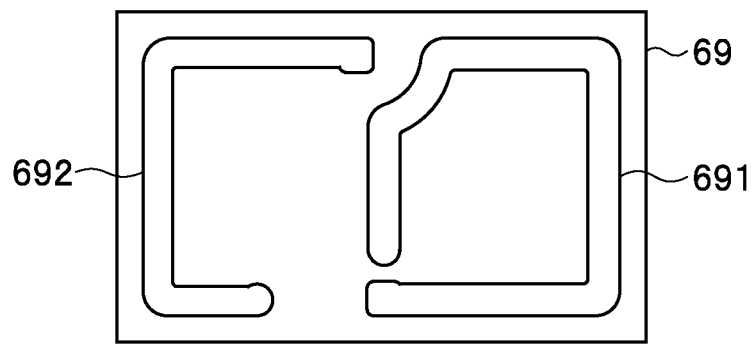
FIG. 9A and FIG. 9B are explanatory diagrams showing respective patterned surfaces of nineteenth to twentieth dielectric layers of the stack of the band-pass filter according to the embodiment of the invention.

FIG. 9A shows the patterned surface of the nineteenth dielectric layer 69. Conductor layers 691 and 692 are formed on the patterned surface of the dielectric layer 69. Each of the conductor layer 691 and 692 has a first end and a second end opposite to each other. The through hole 68T1 formed in the dielectric layer 68 is connected to a portion of the conductor layer 691 near the first end thereof. The through hole 68T2 formed in the dielectric layer 68 is connected to a portion of the conductor layer 692 near the first end thereof. The through hole 68T3 formed in the dielectric layer 68 is connected to a portion of the conductor layer 691 near the second end thereof. The through hole 68T4 formed in the dielectric layer 68 is connected to a portion of the conductor layer 692 near the second end thereof.

Figure 9B:
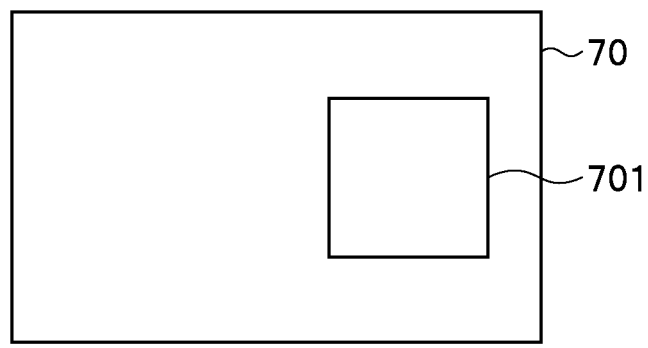

FIG. 9B shows the patterned surface of the twentieth dielectric layer 70. A mark 701 made of a conductor layer is formed on the patterned surface of the dielectric layer 70.

The stack 50 shown in FIG. 2 is formed by stacking the first to twentieth dielectric layers 51 to 70 such that the patterned surface of the first dielectric layer 51 serves as the bottom surface 50A of the stack 50 and the surface of the twentieth dielectric layer 70 opposite to the patterned surface thereof serves as the top surface 50B of the stack 50.

Figure 10:
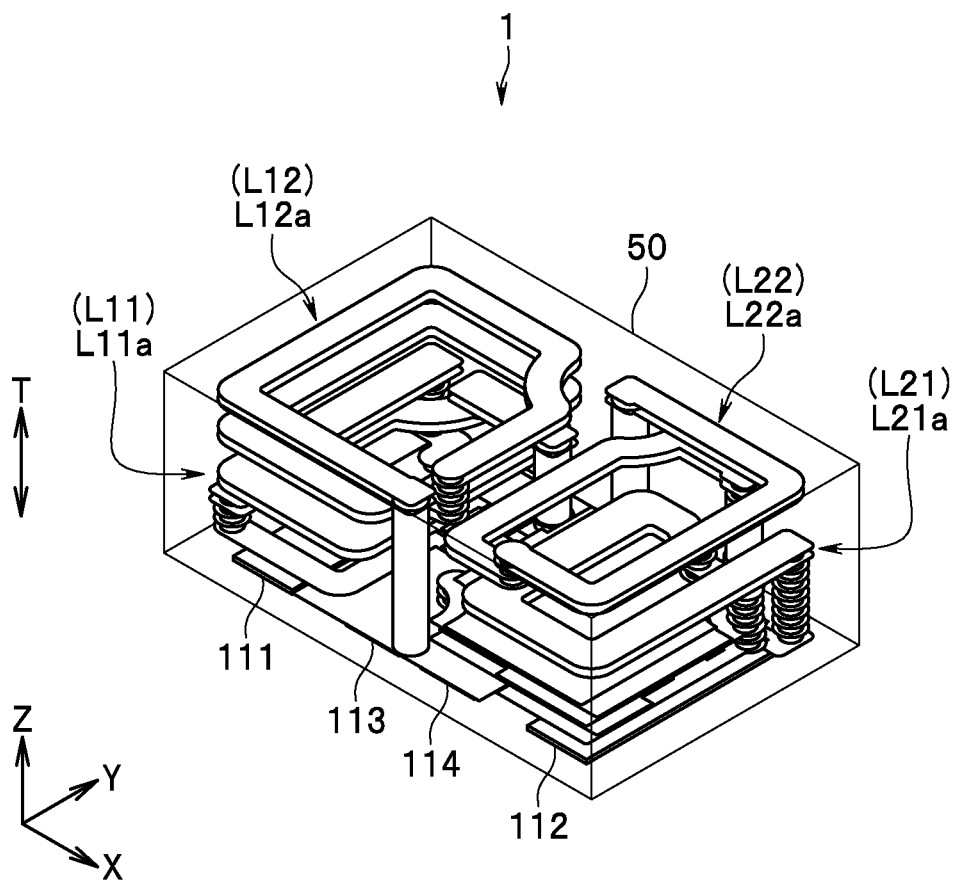
FIG. 10 is a perspective view showing an internal structure of the stack of the band-pass filter according to the embodiment of the invention.
Figure 11:
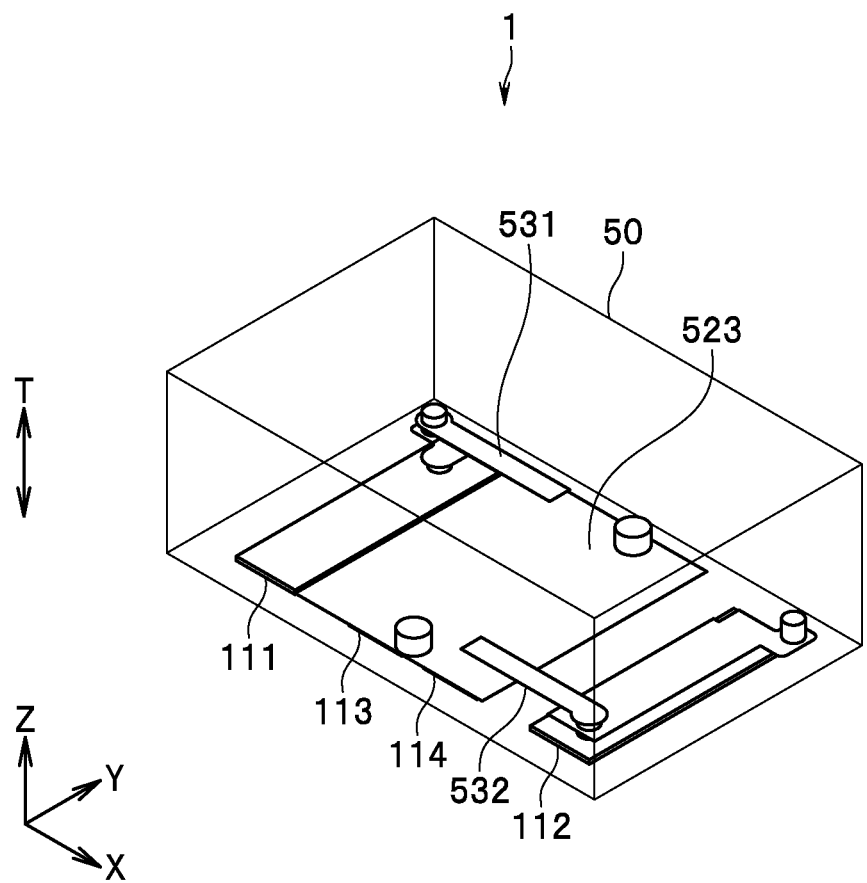
FIG. 11 is a perspective view showing a part of the internal structure of the stack shown in FIG. 10.

FIG. 10 shows an internal structure of the stack 50 formed by stacking the first to twentieth dielectric layers 51 to 70. As shown in FIG. 10, the plurality of conductor layers and the plurality of through holes shown in FIG. 3A to FIG. 9B are stacked inside the stack 50. In FIG. 10, the mark 701 is omitted. FIG. 11 shows a part of the internal structure of the stack 50 shown in FIG. 10. Specifically, FIG. 11 mainly shows the ground conductor layer 523, the first conductor line 531, and the second conductor line 532.

Correspondences between the circuit components of the band-pass filter 1 shown in FIG. 1 and the internal components of the stack 50 shown in FIG. 3A to FIG. 9B will now be described. The components of the first low-pass filter 11 will initially be described. The inductor L1 is composed of the conductor layers 571, 581, 591, and 601 shown in FIG. 5A to FIG. 6A and the through holes connected to those conductor layers. As employed herein, the shape of a conductor layer seen in a direction (Z direction) parallel to the stacking direction T will be referred to as the planar shape of the conductor layer. In particular, in the present embodiment, the planar shape of the conductor layer 571 and that of the conductor layer 581 are the same or substantially the same. The planar shape of the conductor layer 591 and that of the conductor layer 601 are the same or substantially the same. The conductor layers 571 and 581 are connected in parallel by the through holes 57T5 and 57T6. The conductor layers 591 and 601 are connected in parallel by the through holes 59T1 and 59T6.

The capacitor C11 is composed of the terminal 111 shown in FIG. 3A, the conductor layer 541 shown in FIG. 4A, and the dielectric layers 51 to 53 each interposed between the terminal 111 and the conductor layer 541.

The capacitor C12 is composed of the ground conductor layer 523 shown in FIG. 3B, the conductor layer 541 shown in FIG. 4A, and the dielectric layers 52 and 53 each interposed between those conductor layers.

Next, the components of the first high-pass filter 12 will be described. The inductor L12 is composed of the conductor layers 641, 651, 681, and 691 shown in FIG. 7B, FIG. 7C, FIG. 8C, and FIG. 9A, and the through holes connected to those conductor layers. In particular, in the present embodiment, the planar shape of the conductor layer 641 and that of the conductor layer 651 are the same or substantially the same. The planar shape of the conductor layer 681 and that of the conductor layer 691 are the same or substantially the same. The conductor layers 641 and 651 are connected in parallel by the through holes 64T1 and 64T5. The conductor layers 681 and 691 are connected in parallel by the through holes 68T1 and 68T3.

The capacitor C13 is composed of the conductor layers 541 and 542 shown in FIG. 4A.

The capacitor C14 is composed of the conductor layers 551, 561, and 572 shown in FIG. 4B to FIG. 5A, and the dielectric layers 55 and 56 each interposed between two of those conductor layers.

The capacitor C15 is composed of the conductor layers 541 and 551 shown in FIG. 4A and FIG. 4B, and the dielectric layer 54 interposed between those conductor layers.

The capacitor C16 is composed of the ground conductor layer 523 shown in FIG. 3B, the conductor layer 542 shown in FIG. 4A, and the dielectric layers 52 and 53 each interposed between those conductor layers.

Next, the components of the second low-pass filter 21 will be described. The inductor L21 is composed of the conductor layers 592, 602, 611, and 621 shown in FIG. 5C to FIG. 6C, and the through holes connected to those conductor layers. In particular, in the present embodiment, the planar shape of the conductor layer 592 and that of the conductor layer 602 are the same or substantially the same. The planar shape of the conductor layer 611 and that of the conductor layer 621 are the same or substantially the same. The conductor layers 592 and 602 are connected in parallel by the through holes 59T5 and 59T9. The conductor layers 611 and 621 are connected in parallel by the through holes 61T2 and 61T5.

The capacitor C21 is composed of the conductor layers 522 and 543 shown in FIG. 3B to FIG. 4A, and the dielectric layers 52 and 53 each interposed between those conductor layers.

Next, the components of the second high-pass filter 22 will be described. The inductor L22 is composed of the conductor layers 661, 671, 682, and 692 shown in FIG. 8A to FIG. 9A, and the through holes connected to those conductor layers. In particular, in the present embodiment, the planar shape of the conductor layer 661 and that of the conductor layer 671 are the same or substantially the same. The planar shape of the conductor layer 682 and that of the conductor layer 692 are the same or substantially the same. The conductor layers 661 and 671 are connected in parallel by the through holes 66T2 and 66T5. The conductor layers 682 and 692 are connected in parallel by the through holes 68T2 and 68T4.

The capacitor C23 is composed of the conductor layers 543, 552, 562, 582, and 592 shown in FIG. 4A to FIG. 5C, and the dielectric layers 54 to 58 each interposed between two of those conductor layers.

The capacitor C24 is composed of the conductor layers 551, 563, 572, and 582 shown in FIG. 4B to FIG. 5B, and the dielectric layers 55 to 57 each interposed between two of those conductor layers.

The capacitor C25 is composed of the conductor layers 543, 551, 562, and 572 shown in FIG. 4A to FIG. 5A, and the dielectric layers 54 to 56 each interposed between two of those conductor layers.

The capacitor C26 is composed of the conductor layers 671 and 682 shown in FIG. 8B and FIG. 8C, and the dielectric layer 68 interposed between those conductor layers.

Next, the components of the resonator 31 will be described. The inductor L31 is composed of the conductor layer 551 and the through holes 55T9 and 56T9 shown in FIG. 4B and FIG. 4C.

The capacitor C31 is composed of the ground conductor layer 523 shown in FIG. 3B, the conductor layer 551 shown in FIG. 4B, and the dielectric layers 52 to 54 each interposed between those conductor layers.

Next, the components of the first stub resonator 41 will be described. The first distributed constant line 41A is composed of the first conductor line 531 shown in FIG. 3C. As shown in FIG. 11, a part of the first conductor line 531 is opposed to the ground conductor layer 523 shown in FIG. 3B. The capacitor C41 is composed of the ground conductor layer 523, the first conductor line 531, and the dielectric layer 52.

Next, the components of the second stub resonator 42 will be described. The second distributed constant line 42A is composed of the second conductor line 532 shown in FIG. 3C. As shown in FIG. 11, a part of the second conductor line 532 is opposed to the ground conductor layer 523 shown in FIG. 3B. The capacitor C42 is composed of the ground conductor layer 523, the second conductor line 532, and the dielectric layer 52.

Figure 12:
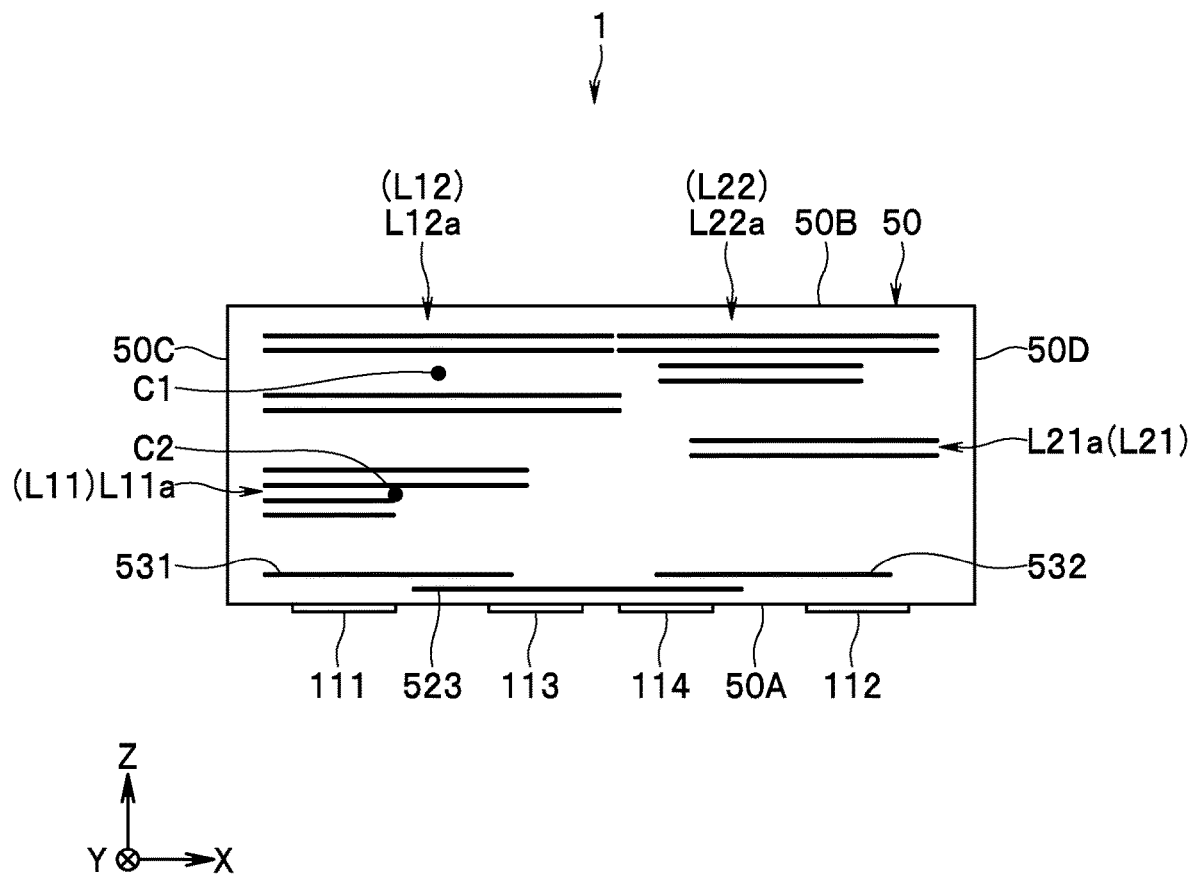
FIG. 12 is a perspective view showing a part of the internal structure of the stack shown in FIG. 10.

Next, structural features of the band-pass filter 1 will be described with reference to FIG. 1 to FIG. 12. FIG. 12 is a cross-sectional view showing a part of the internal structure of the stack 50 shown in FIG. 10. The plurality of conductor layers of the stack 50 include at least one first conductor layer, at least one second conductor layer, at least one third conductor layer, at least one fourth conductor layer, and the ground conductor layer 523. The at least one first conductor layer constitutes the inductor L12 of the first high-pass filter 12. The at least one second conductor layer constitutes the inductor L11 of the first low-pass filter 11. The at least one third conductor layer constitutes the inductor L22 of the second high-pass filter 22. The at least one fourth conductor layer constitutes the inductor L21 of the second low-pass filter 21. The ground conductor layer 523 is connected to the ground. In the stack 50 shown in FIG. 3A to FIG. 10, the conductor layers 641, 651, 681, and 691 correspond to the first conductor layers. The conductor layers 571, 581, 591, and 601 correspond to the second conductor layers. The conductor layers 661, 671, 682, and 692 correspond to the third conductor layers. The conductor layers 592, 602, 611, and 621 correspond to the fourth conductor layers.

The group of the first conductor layers 641, 651, 681, and 691, the group of the second conductor layers 571, 581, 591, and 601, and the ground conductor layer 523 are located at different positions in the stacking direction T, respectively. The second conductor layers 571, 581, 591, and 601 are located between the first conductor layers 641, 651, 681, and 691 and the ground conductor layer 523 in the stacking direction T. The first conductor layers 641, 651, 681, and 691 and the second conductor layers 571, 581, 591, and 601 are located between the ground conductor layer 523 and the top surface 50B of the stack 50 in the stacking direction T.

The inductor L12 of the first high-pass filter 12 includes a first portion L12a including the first conductor layers 641, 651, 681, and 691. The first portion L12a has a first end E12a closest to the terminal 112 constituting the second input/output port 3 in the circuit configuration, and a second end E12b farthest from the terminal 112 in the circuit configuration. As shown in FIG. 7B, the part of the first conductor layer 641 that is connected to the through hole 63T1 corresponds to the first end E12a. As shown in FIG. 8C, the part of the first conductor layer 681 that is connected to the through hole 67T3 corresponds to the second end E12b. The first portion L12a, when seen in the direction (Z direction) parallel to the stacking direction T, is wound in a first winding direction D1 (see FIG. 8C) from the first end E12a to the second end E12b.

The inductor L11 of the first low-pass filter 11 includes a second portion L11a including the second conductor layers 571, 581, 591, and 601. The second portion L11a has a third end E11a closest to the terminal 112 constituting the second input/output port 3 in the circuit configuration, and a fourth end E11b farthest from the terminal 112 in the circuit configuration. As shown in FIG. 5A, the part of the second conductor layer 571 that is connected to the through hole 56T5 corresponds to the third end E11a. As shown in FIG. 5C, the part of the second conductor layer 591 that is connected to the through hole 58T1 corresponds to the fourth end E11b. The second portion L11a, when seen in the direction (Z direction) parallel to the stacking direction T, is wound in a second winding direction D2 (see FIG. 5C) opposite to the first winding direction D1 from the third end E11a to the fourth end E11b.

In FIG. 12, the center of the group of the first conductor layers 641, 651, 681, and 691 in the stacking direction T is denoted by the reference symbol C1, and the center of the group of the second conductor layers 571, 581, 591, and 601 in the stacking direction T is denoted by the reference symbol C2. The distance from the center C2 to the center C1 is greater than the distance from the center C2 to the ground conductor layer 523.

The group of the third conductor layers 661, 671, 682, and 692, the group of the fourth conductor layers 592, 602, 611, and 621, and the ground conductor layer 523 are located at respective different positions in the stacking direction T. The fourth conductor layers 592, 602, 611, and 621 are located between the third conductor layers 661, 671, 682, and 692 and the ground conductor layer 523 in the stacking direction T. The third conductor layers 661, 671, 682, and 692 and the fourth conductor layers 592, 602, 611, and 621 are located between the ground conductor layer 523 and the top surface 50B of the stack 50 in the stacking direction T.

The inductor L22 of the second high-pass filter 22 includes a third portion L22a including the third conductor layers 661, 671, 682, and 692. The third portion L22a has a fifth end E22a closest to the terminal 112 constituting the second input/output port 3 in the circuit configuration, and a sixth end E22b farthest from the terminal 112 in the circuit configuration. As shown in FIG. 8A, the part of the third conductor layer 661 that is connected to the through hole 65T2 corresponds to the fifth end E22a. As shown in FIG. 8C, the part of the third conductor layer 682 that is connected to the through hole 67T4 corresponds to the sixth end E22b. The third portion L22a, when seen in the direction (Z direction) parallel to the stacking direction T, is wound in a third winding direction D3 (see FIG. 8C) from the fifth end E22a to the sixth end E22b.

The inductor L21 of the second low-pass filter 21 includes a fourth portion L21a including the fourth conductor layers 592, 602, 611, and 621. The fourth portion L21a has a seventh end E21a closest to the terminal 112 constituting the second input/output port 3 in the circuit configuration, and an eighth end E21b farthest from the terminal 112 in the circuit configuration. As shown in FIG. 6B, the part of the fourth conductor layer 611 that is connected to the through hole 60T2 corresponds to the seventh end E21a. As shown in FIG. 5C, the part of the fourth conductor layer 592 that is connected to the through hole 58T5 corresponds to the eighth end E21b. The fourth portion L21a, when seen in the direction (Z direction) parallel to the stacking direction T, is wound in a fourth winding direction D4 (see FIG. 6B) opposite to the third winding direction D3 from the seventh end E21a to the eighth end E21b.

The first conductor layers 641 and 651 constituting the inductor L12 of the first high-pass filter 12 and the third conductor layers 661 and 671 constituting the inductor L22 of the second high-pass filter 22 are located at different positions in the stacking direction T. The second conductor layers 571 and 581 constituting the inductor L11 of the first low-pass filter 11 and the fourth conductor layers 611 and 621 constituting the inductor L21 of the second low-pass filter 21 are located at different positions in the stacking direction T.

Now, the operation and effects of the band-pass filter 1 according to the present embodiment will be described. The band-pass filter 1 according to the present embodiment includes the first and second high-pass filters 12 and 22, the first and second low-pass filters 11 and 21, and the first and second stub resonators 41 and 42. The first and second low-pass filters 11 and 21 and the first and second stub resonators 41 and 42 each form an attenuation pole on the high frequency side of the passband of the band-pass filter 1. According to the present embodiment, the provision of the first and second stub resonators 41 and 42 can increase the pass attenuation on the high frequency side of the passband.

The operation and effects of the first and second stub resonators 41 and 42 will be described below with reference to simulation results. In the simulation, a model of the band-pass filter 1 according to the present embodiment (hereinafter, referred to as a model of the practical example) and a model of a band-pass filter according to a comparative example (hereinafter, referred to as a model of the comparative example) without the first and second stub resonators 41 and 42 were used. The band-pass filter of the comparative example has the same configuration as that of the band-pass filter 1 according to the present embodiment except for the absence of the first and second stub resonators 41 and 42.

Figure 13:
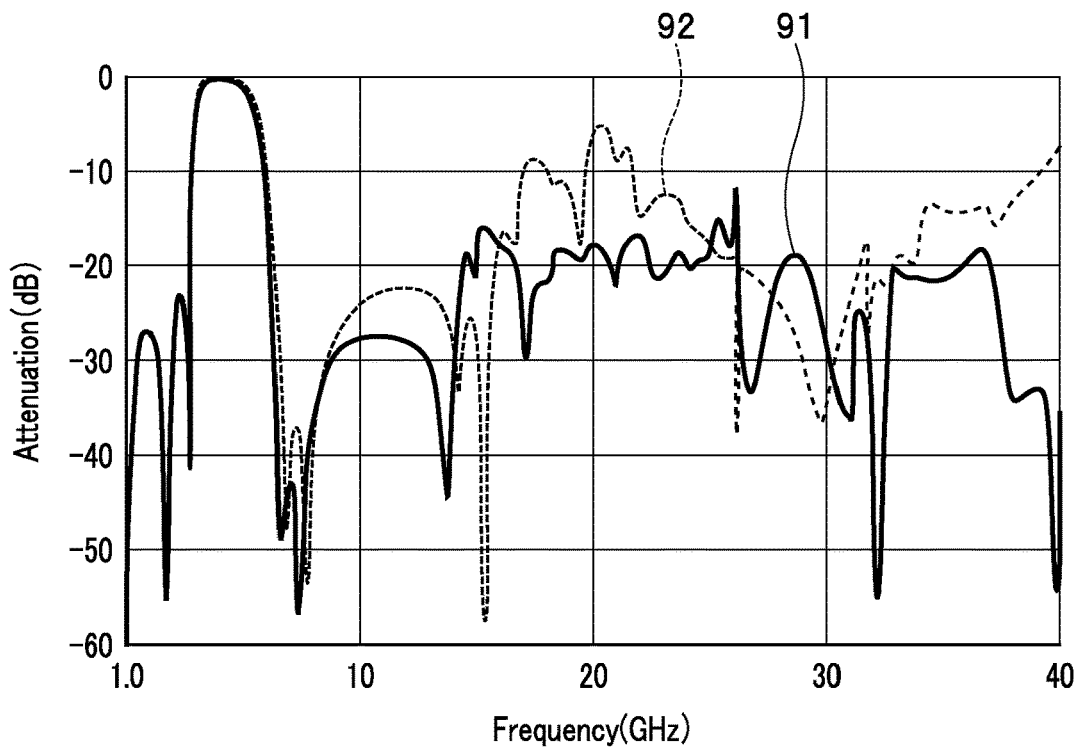
FIG. 13 is a characteristic chart showing examples of pass characteristics of a model of a practical example and a model of a comparative example.
Figure 14:
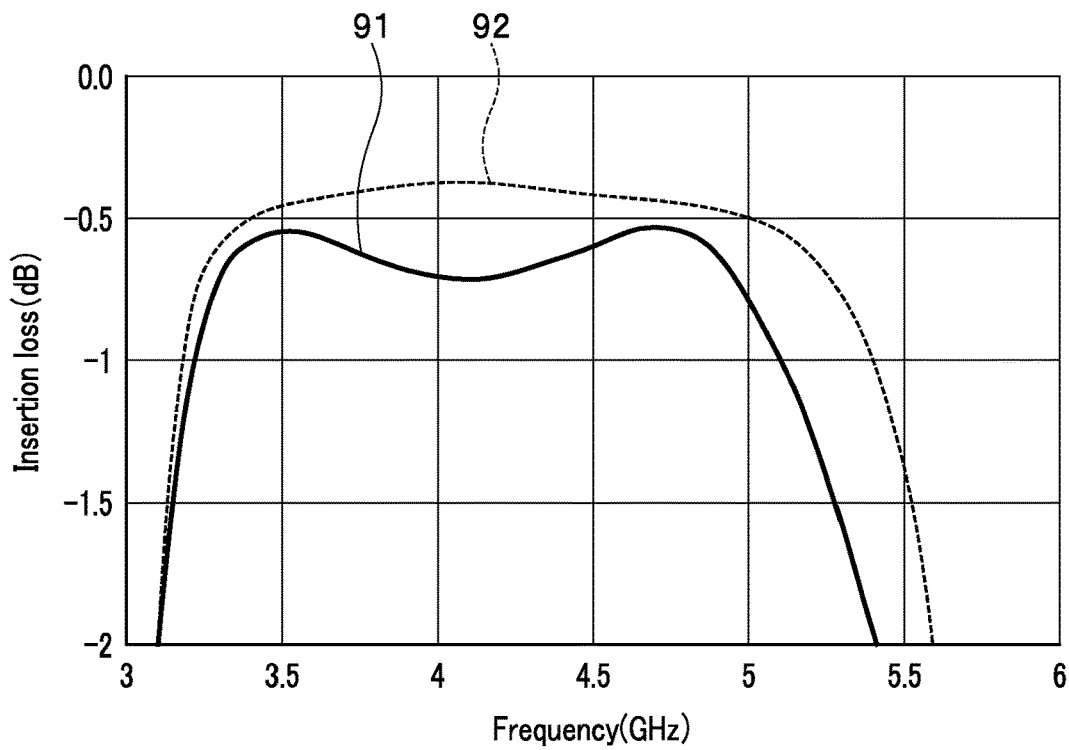
FIG. 14 is a characteristic chart showing insertion loss of the models of the practical example and the comparative example.
Figure 15:
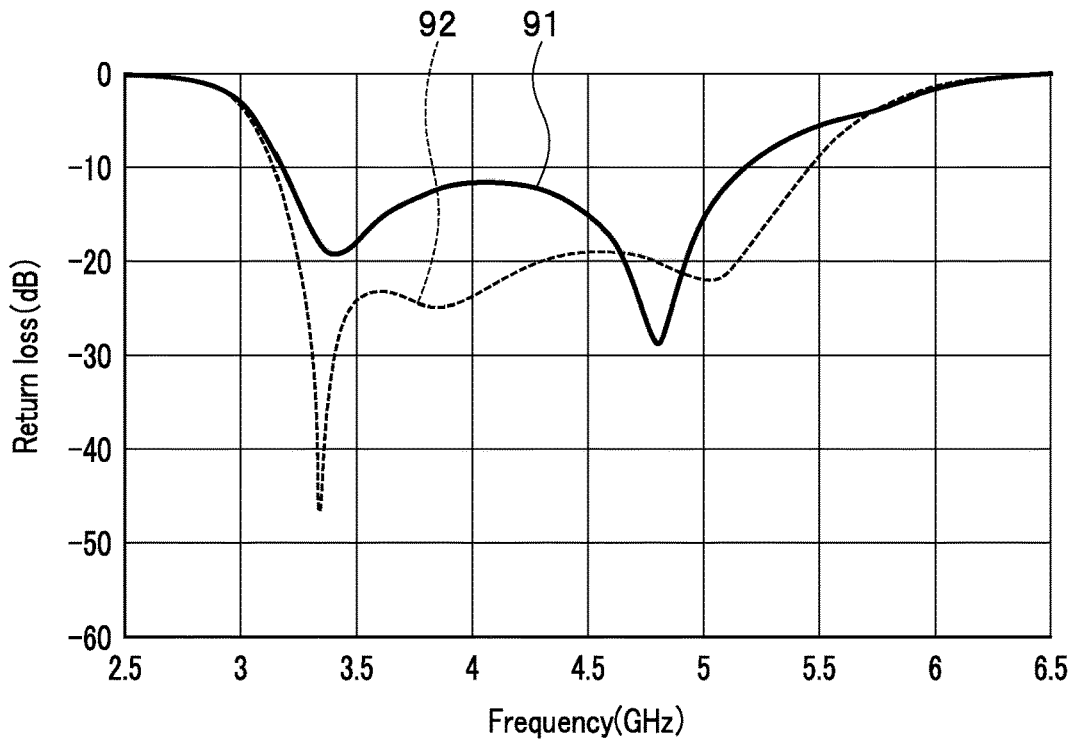
FIG. 15 is a characteristic chart showing return loss at a first input/output port in each of the models of the practical example and the comparative example.
Figure 16:
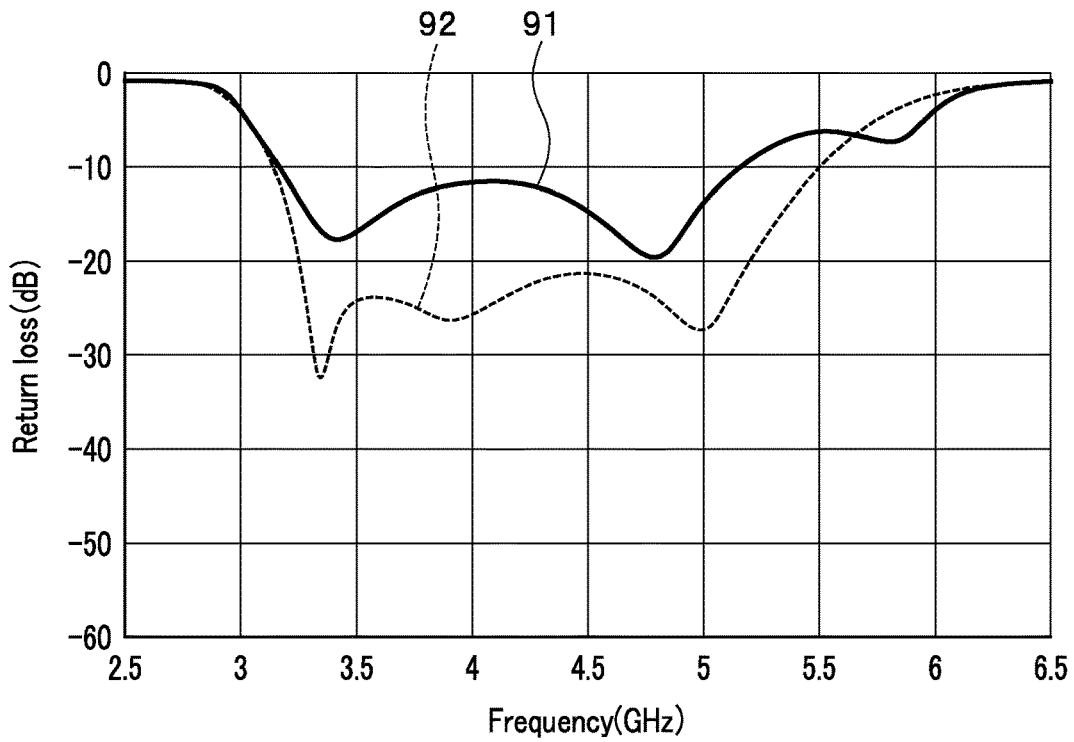
FIG. 16 is a characteristic chart showing return loss at a second input/output port in each of the models of the practical example and the comparative example.

FIG. 13 is a characteristic chart showing the pass characteristics of the models of the practical example and the comparative example. FIG. 14 is a characteristic chart showing examples of insertion loss near the passband. FIG. 15 is a characteristic chart showing the return loss at the first input/output port 2. FIG. 16 is a characteristic chart showing the return loss at the second input/output port 3. In FIG. 13 to FIG. 16, the curves denoted by the reference numeral 91 represent the characteristics of the model of the practical example. The curves denoted by the reference numeral 92 represent the characteristics of the model of the comparative example. In FIG. 13 to FIG. 16, the horizontal axis indicates frequency. In FIG. 13, the vertical axis indicates attenuation. In FIG. 14, the vertical axis indicates insertion loss. In FIG. 15 and FIG. 16, the vertical axis indicates return loss.

From the result of the simulation shown in FIG. 13, it can be seen that according to the present embodiment, the provision of the first and second stub resonators 41 and 42 can increase the pass attenuation near 20 GHz.

Next, other effects of the band-pass filter 1 according to the present embodiment will be described. As described above, in the present embodiment, the second conductor layers 571, 581, 591, and 601 constituting the inductor L11 of the first low-pass filter 11 are located between the first conductor layers 641, 651, 681, and 691 constituting the inductor L12 of the first high-pass filter 12 and the ground conductor layer 523 in the stacking direction T. According to the present embodiment, the bottom surface 50A and the top surface 50B of the stack 50 can thus be reduced in area compared to the case where the first conductor layers constituting the inductor L12 of the first high-pass filter 12 and the second conductor layers constituting the inductor L11 of the first low-pass filter 11 are located at the same positions in the stacking direction T.

Now, suppose that the second conductor layers constituting the inductor L11 of the first low-pass filter 11 are located between the ground conductor layer connected to the ground and the bottom surface 50A of the stack where the plurality of terminals 111 to 116 are located. In such a case, a reduction in the dimension of the stack 50 in the stacking direction T lowers the Q value of the first low-pass filter 11 due to an interaction of electromagnetic fields between the second conductor layers and the ground conductor layer and between the second conductor layers and the plurality of terminals 111 to 116. To avoid this, the distance between the second conductor layers and the ground conductor layer and the distance between the second conductor layers and the plurality of terminals 111 to 116 need to be somewhat large. In contrast, in the present embodiment, the second conductor layers 571, 581, 591, and 601 are located between the ground conductor layer 523 and the top surface 50B of the stack 50 in the stacking direction T. According to the present embodiment, the dimension of the stack 50 in the stacking direction T can thus be reduced as much as the distance between the second conductor layers and the plurality of terminals 111 to 116 in the foregoing case while preventing a drop in the Q value of the first low-pass filter 11.

In the present embodiment, the distance from the center C2 of the group of the second conductor layers 571, 581, 591, and 601 in the stacking direction T to the center C1 of the group of the first conductor layers 641, 651, 681, and 691 in the stacking direction T is greater than the distance from the center C2 to the ground conductor layer 523. According to the present embodiment, the interaction of electromagnetic fields between the second layers 571, 581, 591, and 601 and the first conductor layers 641, 651, 681, and 691 can thus be reduced compared to the case where the distance from the center C2 to the center C1 is smaller than the distance from the center C2 to the ground conductor layer 523.

Similarly, in the present embodiment, the fourth conductor layers 592, 602, 611, and 621 constituting the inductor L21 of the second low-pass filter 21 are located between the third conductor layers 661, 671, 682, and 692 constituting the inductor L22 of the second high-pass filter 22 and the ground conductor layer 523 in the stacking direction T. Moreover, the fourth conductor layers 592, 602, 611, and 621 are located between the ground conductor layer 523 and the top surface 50B of the stack 50 in the stacking direction T. According to the present embodiment, the bottom surface 50A and the top surface 50B of the stack 50 can thus be reduced in area and the dimension of the stack 50 in the stacking direction T can be reduced as well while preventing a drop in the Q value of the second low-pass filter 21.

According to the present embodiment, miniaturization and desired characteristics can thus be achieved while suppressing interaction between the conductor layers.

In the present embodiment, as described above, each of the inductors L11, L12, L21, and L22 includes sets of two conductor layers that have the same or substantially the same planar shapes and are connected in parallel by through holes. For example, the inductor L11 includes a set of conductor layers 571 and 581 connected in parallel and a set of conductor layers 591 and 601 connected in parallel. According to the present embodiment, the direct-current resistance of each of the inductors L11, L12, L21, and L22 can thus be reduced to increase the Q value of each of the inductors L11, L12, L21, and L22.

The present invention is not limited to the foregoing embodiment, and various modifications may be made thereto. For example, the configuration of each of the high- and low-pass filters of the present invention is not limited to the example described in the foregoing embodiment and may be optional as long as the requirements set forth in the claims are satisfied.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A band-pass filter that selectively passes a signal of a frequency within a predetermined passband, the band-pass filter comprising:
   a first input/output port;
   a second input/output port; and
   a first high-pass filter, a first low-pass filter, and a first stub resonator that are between the first input/output port and the second input/output port in a circuit configuration, wherein:
   the first input/output port, the second input/output port, the first high-pass filter and the first low-pass filter are configured in the circuit configuration such that the signal inputted to one of the first input/output port and the second input/output port passes through the first high-pass filter and the first low-pass filter and is outputted from a second of the first input/output port and the second input/output port;
   each of the first high-pass filter and the first low-pass filter includes at least one first inductor and at least one first capacitor;
   the first stub resonator includes a first distributed constant line;
   the first low-pass filter is between the first input/output port and the first high-pass filter in the circuit configuration; and
   the first distributed constant line has a first end connected to a first path connecting the first input/output port and the first low-pass filter and a second end closest to a ground in the circuit configuration.

2. The band-pass filter according to claim 1, wherein the first stub resonator further includes a second capacitor between the first distributed constant line and the ground in the circuit configuration.

3. The band-pass filter according to claim 1, wherein each of the first low-pass filter and the first stub resonator forms an attenuation pole on a high frequency side of the passband.

4. The band-pass filter according to claim 1, wherein the first distributed constant line is a quarter-wave line.

5. The band-pass filter according to claim 1, further comprising a stack that (i) integrates the first input/output port, the second input/output port, the first high-pass filter, the first low-pass filter, and the first stub resonator and (ii) includes a plurality of dielectric layers and a plurality of conductor layers stacked together, wherein:
the plurality of conductor layers include a first conductor line constituting the first distributed constant line and a ground conductor layer connected to the ground; and
a part of the first conductor line is opposed to the ground conductor layer.

6. The band-pass filter according to claim 1, further comprising a second high-pass filter, a second low-pass filter, and a second stub resonator that are between the first high-pass filter and the second input/output port in the circuit configuration, wherein:
each of the second high-pass filter and the second low-pass filter includes at least one second inductor and at least one second capacitor;
the second stub resonator includes a second distributed constant line;
the second low-pass filter is between the second input/output port and the second high-pass filter in the circuit configuration; and
the second distributed constant line has a third end connected to a second path connecting the second input/output port and the second low-pass filter and a fourth end closest to the ground in the circuit configuration.

7. The band-pass filter according to claim 6, wherein the second stub resonator further includes a third capacitor between the second distributed constant line and the ground in the circuit configuration.

8. The band-pass filter according to claim 6, wherein each of the second low-pass filter and the second stub resonator forms an attenuation pole on a high frequency side of the passband.

9. The band-pass filter according to claim 6, wherein the second distributed constant line is a quarter-wave line.

10. The band-pass filter according to claim 6, further comprising a stack that (i) integrates the first input/output port, the second input/output port, the first high-pass filter, the first low-pass filter, the first stub resonator, the second high-pass filter, the second low-pass filter, and the second stub resonator and (ii) includes a plurality of dielectric layers and a plurality of conductor layers stacked together, wherein:
the plurality of conductor layers include a first conductor line constituting the first distributed constant line, a second conductor line constituting the second distributed constant line, and a ground conductor layer connected to the ground; and
a part of the first conductor line and a part of the second conductor line are opposed to the ground.

11. The band-pass filter according to claim 6, further comprising at least one resonator between the first high-pass filter and the second high-pass filter in the circuit configuration.

12. The band-pass filter according to claim 11, wherein the at least one resonator includes a third inductor provided between a third path connecting the first high-pass filter to the second high-pass filter and the ground in the circuit configuration.

* * * * *